(12) United States Patent
Tabaian et al.

(10) Patent No.: US 7,414,385 B2
(45) Date of Patent: Aug. 19, 2008

(54) CHIPSET FOR ISOLATED POWER SUPPLY WITH NEW PROGRAMMABLE SYNCHRONIZATION ARCHITECTURE

(75) Inventors: Fereydun Tabaian, Newport Coast, CA (US); Hamed Sadati, Dubai (AE); Ali Hejazi, Dubai (AE)

(73) Assignee: NuPower Semiconductor, Inc., Newport Beach, CA (US)

( * ) Notice: Subject to any disclaimer, the term of this patent is extended or adjusted under 35 U.S.C. 154(b) by 178 days.

(21) Appl. No.: 11/301,187

(22) Filed: Dec. 12, 2005

(65) Prior Publication Data

US 2006/0125450 A1 Jun. 15, 2006

Related U.S. Application Data

(60) Provisional application No. 60/634,910, filed on Dec. 10, 2004, provisional application No. 60/634,858, filed on Dec. 10, 2004.

(51) Int. Cl.
*G05F 1/56* (2006.01)
(52) U.S. Cl. .......................................... 323/288; 363/16
(58) Field of Classification Search ......... 323/282–288; 363/16–20, 89
See application file for complete search history.

(56) References Cited

U.S. PATENT DOCUMENTS

| | | | | |
|---|---|---|---|---|
| 5,077,486 A | * | 12/1991 | Marson et al. | 205/728 |
| 5,298,851 A | * | 3/1994 | DeNardis | 322/28 |
| 6,879,137 B2 | * | 4/2005 | Sase et al. | 323/282 |

OTHER PUBLICATIONS

Data Sheet, Texas Instruments Inc., "High-Frequency, Multiphase Controller", pp. 1-21, Part No. TPS40090, SLUS578—Oct. 2003.
Data Sheet, Intersil Americas Inc., "Microprocessor CORE Voltage Regulator Precision Multi-Phase BUCK PWM Controller for Mobile Applications", pp. 1-17, Part No. ISL6219A, Nov. 2002, FN9093.
Data Sheet, Maxim Integrated Products, "Parallelable Secondary-Side Synchronous Rectifier Driver and Feedback-Generator Controller ICs", pp. 1-25, Part No. MAX5058/MAX5059, 19-3045; Rev 0; Oct. 2003.

* cited by examiner

*Primary Examiner*—Rajnikant B Patel
(74) *Attorney, Agent, or Firm*—Seyed Kaveh E. Rashidi-Yazd, Esq.; Troutman Sanders LLP

(57) ABSTRACT

The present invention is a chipset for an isolated power supply having an innovative oscillator. Preferably, the present invention includes a primary controller and a secondary controller. The primary controller can have the control and drive circuitry for the chipset. The secondary controller can provide rectification signals that can be synchronized with a power MOSFET.

9 Claims, 6 Drawing Sheets

CHIPSET FOR ISOLATED POWER SUPPLY WITH NEW PROGRAMMABLE SYNCHRONIZATION ARCHITECTURE

CROSS-REFERENCE TO RELATED APPLICATIONS

This application claims benefit, under 35 U.S.C. § 119(e), of U.S. Provisional Application Ser. Nos. 60/634,858 and 60/634,910, both filed 10 Dec. 2004, the entire contents and substance of which are hereby incorporated by reference.

BACKGROUND

1. Field of the Invention

The present invention relates to a chipset for isolated power supplies and, more particularly, to primary and secondary side devices in a chipset for isolated power supplies with programmable synchronization architecture.

2. Description of Related Art

Primary and secondary controllers can be used for isolated power supplies. Indeed, MAXIM® MAX5042/MAX5043, which is a two-switch power integrated circuit with integrated power MOSFETs and hot-swap controller, and MAX5058/5059, which is a parallelable secondary-side synchronous rectifier driver and feedback-generator controller integrated circuit, are primary and secondary controllers, respectively, for isolated power supplies and can be used together. The MAXIM chipset enables synchronous rectification in isolated powers supplies using widely available MOSFETs (Metal Oxide Semiconductor Field Effect Transistors). Unfortunately, the MAXIM chipset is not programmable, nor does it configure inductors to deliver current to a load.

What is needed is a programmable synchronous rectifier. Moreover, there is a need for the programmable synchronous rectifier to have a configuration of an inductor to deliver current to a load, while the chipset has a whole chipset configuration having the functions required for an isolated power supply. It is to such a device that various embodiments of the present invention are directed.

SUMMARY

A programmable synchronous rectifier can enhance high efficiency isolated power supplies by including multiple rectification signals, built-in trimmed band-gap circuits, error amplifiers, over-voltage protection and secondary side controllers. The present invention can provide a rectification signal that is synchronized to a power MOSFET switching in a primary side of the isolation transformer; accordingly, this signal can be blocked by reverse current detection through low offset, fast comparator devices.

The present invention is a chipset for a power supply, wherein the chipset has programmable synchronization architecture. The present invention includes a primary controller and a secondary controller.

The primary controller is a dual-ended, high speed, highly integrated pulse width modulating controller. Typically, the primary controller can be optimized for applications requiring minimum space, as the primary controller can contain the necessary control circuitry required for isolated applications, wherein a secondary side error amplifier can be utilized. The primary controller is designed to be fully featured and requires only a few external components.

The primary controller comprises the control and drive circuitry required for isolated or non-isolated power supplies, wherein an external error amplifier can be implemented. A fixed oscillator frequency, typically up to 1 MHz, can be programmed by an external resistor\capacitor network. The primary controller can have a peak current or voltage mode controller, depending on the amount of slope compensation, which can be programmable with only one external resistor. The cycle-by-cycle peak current limit prevents core saturation when a transformer is used for isolation, while the over-current circuitry initiates a soft start cycle. The primary controller can also include internal slope compensation, pulse-by-pulse current limiting, a line monitoring input with hysteresis to reduce stress on power components. Additionally, an internal ramp on the current sensing pin, ISENSE, enables slope compensation to be programmed simply by an external resistor. This further enables operation in voltage mode.

An oscillator can be utilized to enable up to two primary controllers to be synchronized together and work out of phase. This feature minimizes input and output ripples, and reduces stress and size on input/output filter components. The primary controller comprises a high speed oscillator having integrated feed forward compensation. Feeding the oscillator of one device to the SYNC pin of another device can force bi-phase operation, which is approximately 180 degrees apart, thereby reducing input ripple and filter size.

Outputs—A and B—of the primary controller can switch at half the oscillator frequency using a toggle flip-flop. The dead time between the two outputs is programmable depending on the values of the timing capacitor and resistors, thus limiting each output stage duty cycle to less than 50%. The primary controller can utilize a feed forward scheme to accommodate for any variations in the input supply voltage resulting in a duty cycle adjustment. This feed forward action results in an improved dynamic performance of the converter. As an added level of protection, the primary controller provides a cycle-by-cycle peak current limit during an over current condition.

The current sense input and internal slope compensation are both provided via the ISENSE pin. The current sense input from a sense resistor is used for the peak current and over current comparators; this is used for comparison to the external error amplifier signal. If an external resistor is connected from ISENSE to the current sense resistor, the internal current source will provide a programmable slope compensation. Accordingly, the value of the resistor will determine the level of compensation. At higher compensation levels, a voltage mode of operation can be achieved. The error amplifier signal at the FB pin will be used in conjunction with the ISENSE signal to achieve regulation.

By connecting an external control signal to SYNC pins of the primary controller, the internal oscillator frequency will be synchronized to the positive edge of the external control signal. In a single controller operation, SYNC should be grounded or connected to an external synchronization clock within the SYNC frequency range. In the bi-phase operation mode, a unique oscillator can be utilized to enable the primary and secondary controllers to be synchronized together and work out of phase. The faster oscillator automatically becomes the master, forcing the two pulse width modulators to operate out of phase. This feature minimizes the input and output ripples, and reduces stress on the capacitors. The feed forward action provides an immediate duty cycle adjustment while maintaining a constant oscillator frequency.

The secondary controller enables high efficiency isolated power supplies by providing rectifications signals, built-in trimmer band-gap, error amplifier, over voltage protection, and other features necessary for secondary side controllers. The secondary controller provides a rectification signal that is synchronized to a power MOSFET switching on the primary side of an isolation transformer; the signal can be blocked by reverse current detection through low offset, fast comparator devices. The features of the secondary controller include having a synchronous rectifier logic, an internal error amplifier, an internal remote sense voltage amplifier, an under-voltage lockout circuit, a reverse current protection, an adjustable over-voltage protection, an open-drain over-voltage flag. Preferably, the secondary controller can be packaged in a 16-pin package.

Additionally, the secondary controller includes a trimmed band gap within an accuracy of approximately 1%, while different output voltages can be selected via two external set pins. Prior to the error amplifier a differential-to-signal (D2S) stage is used through which remote sensing is possible.

These and other objects, features, and advantages of the present invention will become more apparent upon reading the following specification in conjunction with the accompanying drawings.

DETAILED DESCRIPTION OF THE PREFERRED EMBODIMENTS

Figure 1:
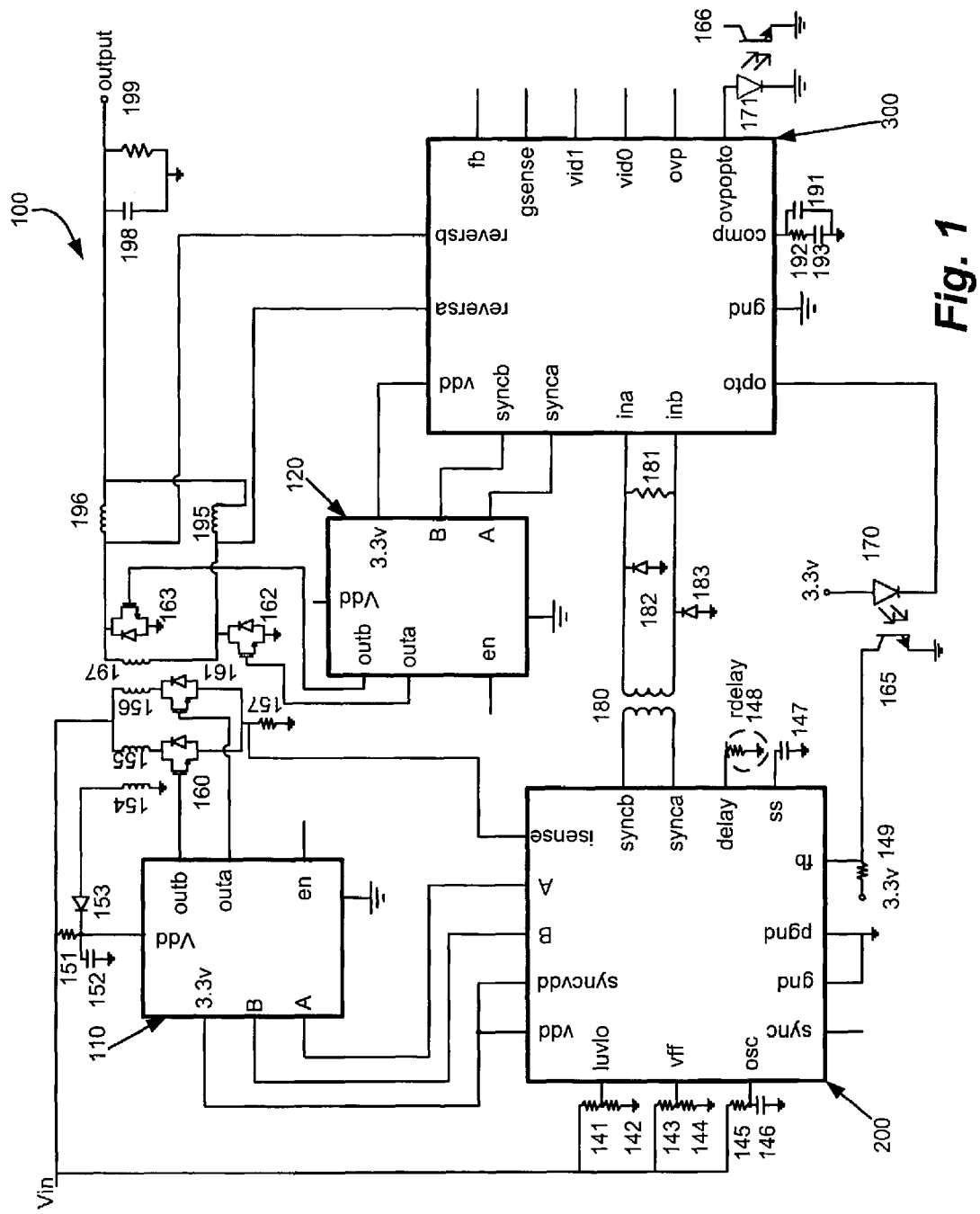
FIG. 1 illustrates a circuit diagram of a chipset for an isolated power supply with programmable synchronization architecture, in accordance with a preferred embodiment of the present invention.

Referring now in detail to the drawing figures, wherein like references represent like parts throughout the several views, FIG. 1 illustrates a circuit diagram of a chipset 100 for an isolated power supply.

The present invention is a chipset 100 comprising a gate driver 110, a gate driver 120, at least two controllers—primary controller 200 and secondary controller 300—and a number of external discrete components. The gate drivers 110 and 120 can independently drive two MOSFETs (Metal Oxide Semiconductor Field Effect Transistors). The primary controller 200 comprises the control and drive circuitry required for isolated or non-isolated power supplies, wherein an external amplifier is utilized. The secondary controller 300 provides a band gap circuit, and an over-current protection circuit.

In a preferred embodiment, the gate drivers 110 and 120 can be National Semiconductor® devices, e.g., part number LM5110. Preferably, the gate driver selected for the present invention has the ability to drive at least two MOSFETs.

Typical applications for various embodiments of the present invention include: telecom equipment and power supplies, networking power supplies, power over LAN applications, industrial power supplies, isolated power supplies, and the like.

Figure 2A:
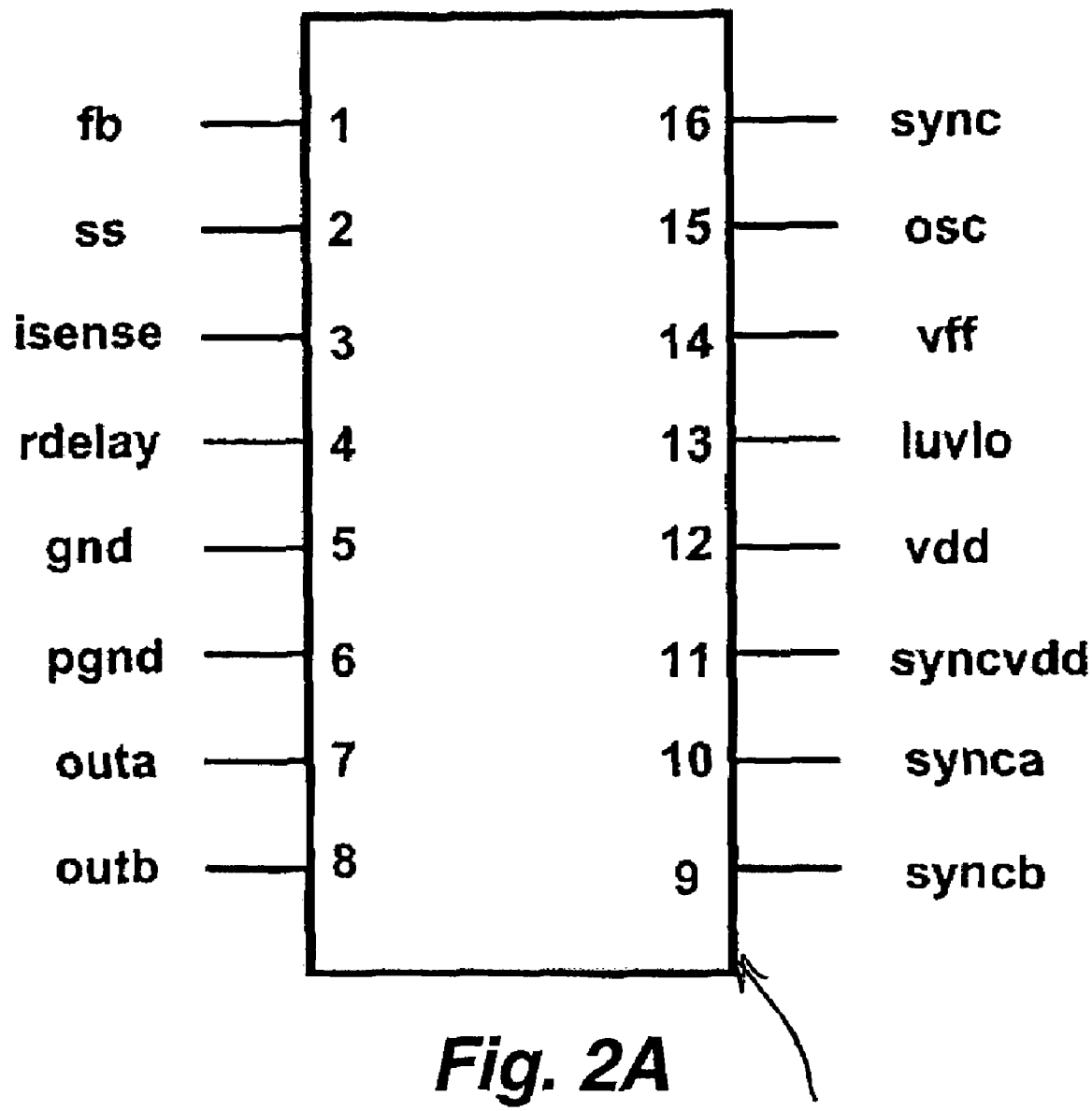
FIG. 2A illustrates an exemplary pin out of a primary controller for the chipset, in accordance with a preferred embodiment of the present invention.

FIG. 2A illustrates the pin outs of the primary controller 200. In a preferred embodiment, the primary controller 200 includes sixteen (16) pins. Although, one skilled in the art will recognize that the primary controller 200 can be packaged with more or less pins. Indeed, in a preferred embodiment, the primary controller 200 is packaged in a 16-pin TSSOP (Thin-Shrink Small Outline Package) package. One skilled in the art will also appreciate that the primary controller 200 can be packaged in a different package.

Table 1 illustrates a description of the preferred pin-outs of the primary controller 200.

TABLE 1

| Pin Name | Pin Number | Pin Function |
| --- | --- | --- |
| FB | 1 | Feedback analog signal from output of an error amplifier |
| SS | 2 | Soft start pin |
| ISENSE | 3 | Current sensing pin |
| RDELAY | 4 | Resistor delay pin |
| GND | 5 | Device analog ground |
| PGND | 6 | Device power ground |
| OUTA | 7 | Out of phase gate drive signal |
| OUTB | 8 | Out of phase gate drive signal |
| SYNCB | 9 | Synchronous rectifier signal with appropriate delay set by RDELAY |
| SYNCA | 10 | Synchronous rectifier signal with appropriate delay set by RDELAY |
| SYNCVdd | 11 | Supply voltage input for SYNC |
| Vdd | 12 | Supply voltage input for the device |
| LUVLO | 13 | Line under voltage lockout pin |
| Vff | 14 | Voltage for feed forward function |
| OSC | 15 | Oscillator programming pin |
| SYNC | 16 | SYNC clock pin |

Generally speaking, the primary controller 200 is a dual-ended, high speed, highly integrated pulse width modulating controller. Typically, the primary controller 200 can be optimized for applications requiring minimum space. The primary controller 200 can be configurable for current or voltage mode operation and can contain the necessary control circuitry required for isolated applications, wherein a secondary side error amplifier can be utilized. The primary controller 200 is designed to be fully featured and requires only a few external components.

Indeed, the primary controller 200 can include a programmable frequency of up to 1 megaHertz (MHz), internal slope compensation, pulse-by-pulse current limiting, a line monitoring input with hysteresis to reduce stress on power components. Additionally, an internal ramp on the current sensing pin, ISENSE, enables slope compensation to be programmed simply by an external resistor. This further enables operation in voltage mode.

An oscillator is utilized to enable up to two primary controllers 200 to be synchronized together and work out of phase. This feature minimizes input and output ripples, and reduces stress and size on input/output filter components. The primary controller 200 comprises a high speed oscillator having integrated feed forward compensation. Feeding the oscillator of one device to the SYNC pin of another device can force bi-phase operation, which is approximately 180 degrees apart, thereby reducing input ripple and filter size.

Figure 2B:
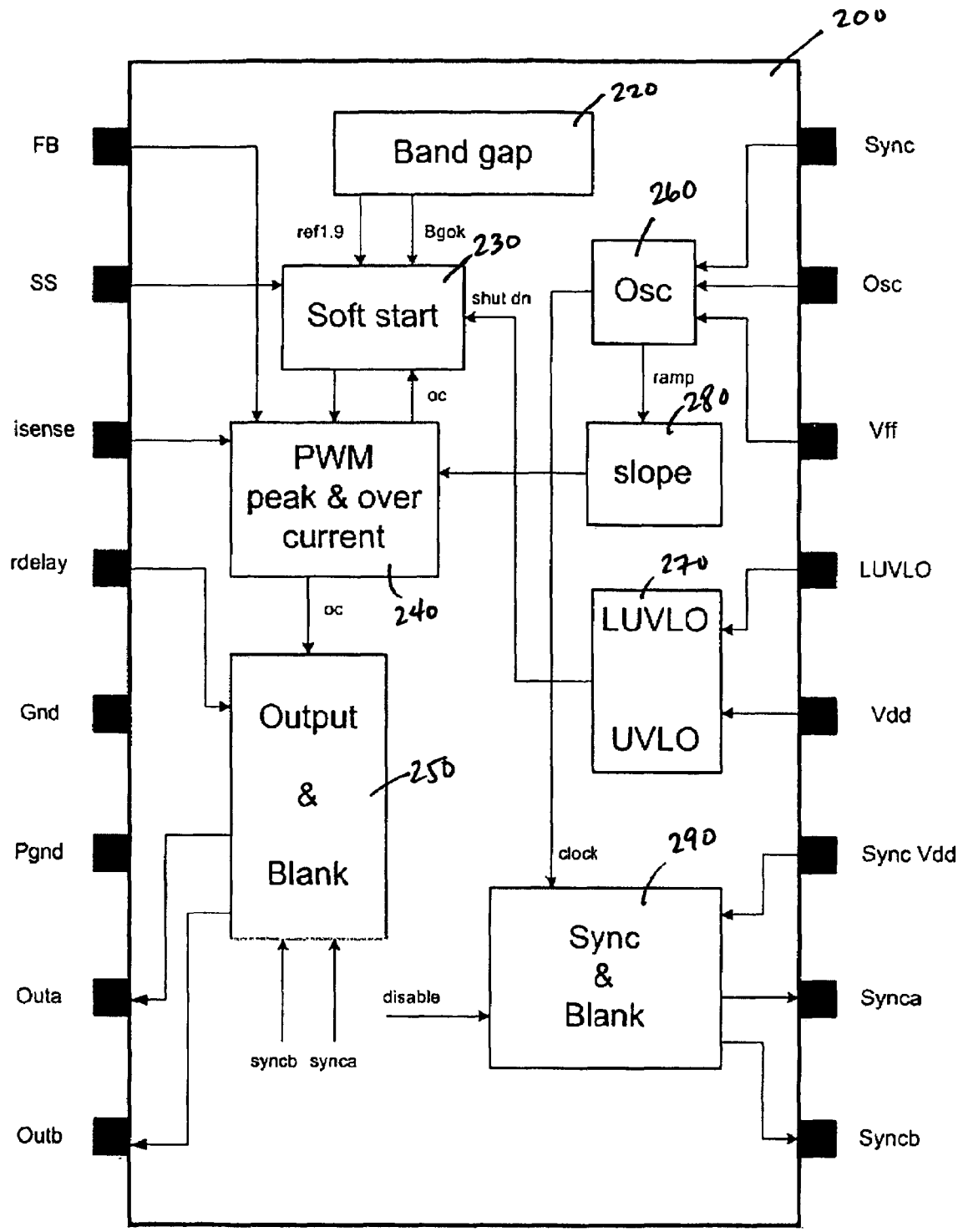
FIG. 2B illustrates a circuit diagram of the primary controller for the chipset, in accordance with a preferred embodiment of the present invention.

FIG. 2B depicts a block circuit diagram of the primary controller 200. The primary controller 200 can comprise a band gap circuit 220, a soft start circuit 230, a pulse width modulating peak and over current circuit 240, an output and blank circuit 250, an oscillator 260, a LUVLO and UVLO circuit 270, a slope circuit 280, and a SYNC and Blank circuit 290.

The band gap circuit 220 generates the reference voltage and current for the primary controller 200. The band gap circuit 220 is used to generate an accurate voltage. The voltage from the band gap circuit 220 must exhibit little dependence on temperature. For producing the temperature independent reference, the band gap 220 is used to produce a reference having a nominally zero temperature coefficient in the band gap circuit 220; preferably, the band gap 220 is trimmed having an accuracy within 1%. A signal created by the band gap circuit 220 is fed into the soft start circuit 230. The band gap 220 can provide the start stop circuit 230 with a 1.9V reference and another signal to identify the status of the band gap 220 (bgok signal). The soft start circuit 230 also receives the signal from the SS pin to start up the primary controller 200. Alternately, the soft start circuit 230 receives a shutdn signal from a line under voltage lockout circuit (LUVLO) 270.

The SS pin is a soft start and enable pin of the device. This means once that the line voltage, Vdd, becomes less than a predetermined value, the primary controller 200 is switched to a shutdown (shutdn) mode.

A signal created by the soft start circuit 230 is fed into the pulse width modulating peak and over current circuit 240, hereinafter referred to as the PWM circuit. The PWM circuit 240 receives signals from the FB pin and the ISENSE pin, and a signal from a slope circuit 280. The result of the PWM circuit is fed into the output and blank circuit 250.

Referring to the PWM circuit 240, the current sense input and internal slope compensation are both provided via the ISENSE pin. The current sense input from an external sense resistor can be used for the peak current and over current comparators. This is used for comparison to the external error amplifier signal. If an external resistor is connected from ISENSE to the current sense resistor, the internal current source will provide programmable slope compensation. The value of the resistor can determine the level of compensation. At higher compensation levels, a voltage mode of operation can be achieved. The error amplifier signal at the FB pin will be used in conjunction with the ISENSE signal to achieve regulation.

The Vdd and LUVLO pins are fed into the LUVLO circuit 270. The signal from the LUVLO circuit can be fed to the soft start circuit 230.

The LUVLO pin, which feeds the LUVLO and UVLO circuit 270, can be programmed with an external resistor divider. The external resistor divider can be referenced to a quiet analog ground. The LUVLO pin can set the turn on threshold to 36V with 2V hysteresis, meaning the device can shut down at 34V. Depending on the application and the voltages available, the UVLO (under voltage lockout function) of the primary controller 200 can be used to provide the Vcc UVLO to ensure the converters controlled start up. Before the Vcc UVLO is reached, the internal reference, the oscillator, OUTA and OUTB driver, and all logic are disabled.

The Vff, OSC and SYNC pins of the primary controller 200 are all fed into the oscillator 260. Vff is the feed forward function provided by the primary controller 200 and can improve the dynamic performance of the controller, in response to changes in the input voltage. Indeed, in controllers absent a voltage feed forward circuitry, changes in the input voltage can cause an error in the output voltage, which is sensed by an error amplifier and is eventually translated to an adjustment in the duty cycle of the controller. This delay in response can cause slower dynamic performance of the converter. In the present invention, this problem can be resolved by sensing the input voltage and making adjustments in the duty cycle immediately, and automatically at the PWM circuit 240.

The oscillator 260 controls the timing of the primary controller 200. A ramp signal from the oscillator 260 is fed into the slope circuit 280, which is eventually fed into the PWM circuit. Also, a clock signal from the oscillator 260 is fed into the Sync & Blank circuit 290.

The frequency of the oscillator 260 can be set by connecting a resistor/capacitor network external to the primary controller 200, as depicted in FIG. 1 and identified as resistor 145 and capacitor 146. The oscillator 260 can have a ramp voltage that can track the voltage at the Vff pin (0.95<Vff<1.9V). The peak voltage of the oscillator 260 can be derived by charging the capacitor 146 to the Vff voltage via the resistor 145. Once the pin of the controller 200 has reached the Vff voltage, the ramp signal of the oscillator 260 is discharged by an internal switch. Since the resistor 145 can be referenced to the input voltage, variation the supply is directly translated into a variation the duty cycle, while maintaining the fixed reference.

Referring back to FIG. 2B, the result of the PWM circuit 240 is fed into the output and blank circuit 250, and is also routed back to the soft start circuit 230, creating a feed back loop. The output and blank circuit 250 receives the signals from SYNCA and SYNCB, RDELAY, and the signal from the PWM circuit 240. The results of the output and blank circuit 250 are fed out through pins OUTA and OUTB.

SYNCA and SYNCB are the drivers for the synchronous rectifier transformer. These pins should be able to drive 50 mA sink and source, without too much drop. A high on the SYNC outputs indicate which synchronous rectifiers switch is to be off. In other words, the natural state of the synchronous rectifier switches are on, and they will turn off when the SYNC outputs change to high.

Figure 3A:
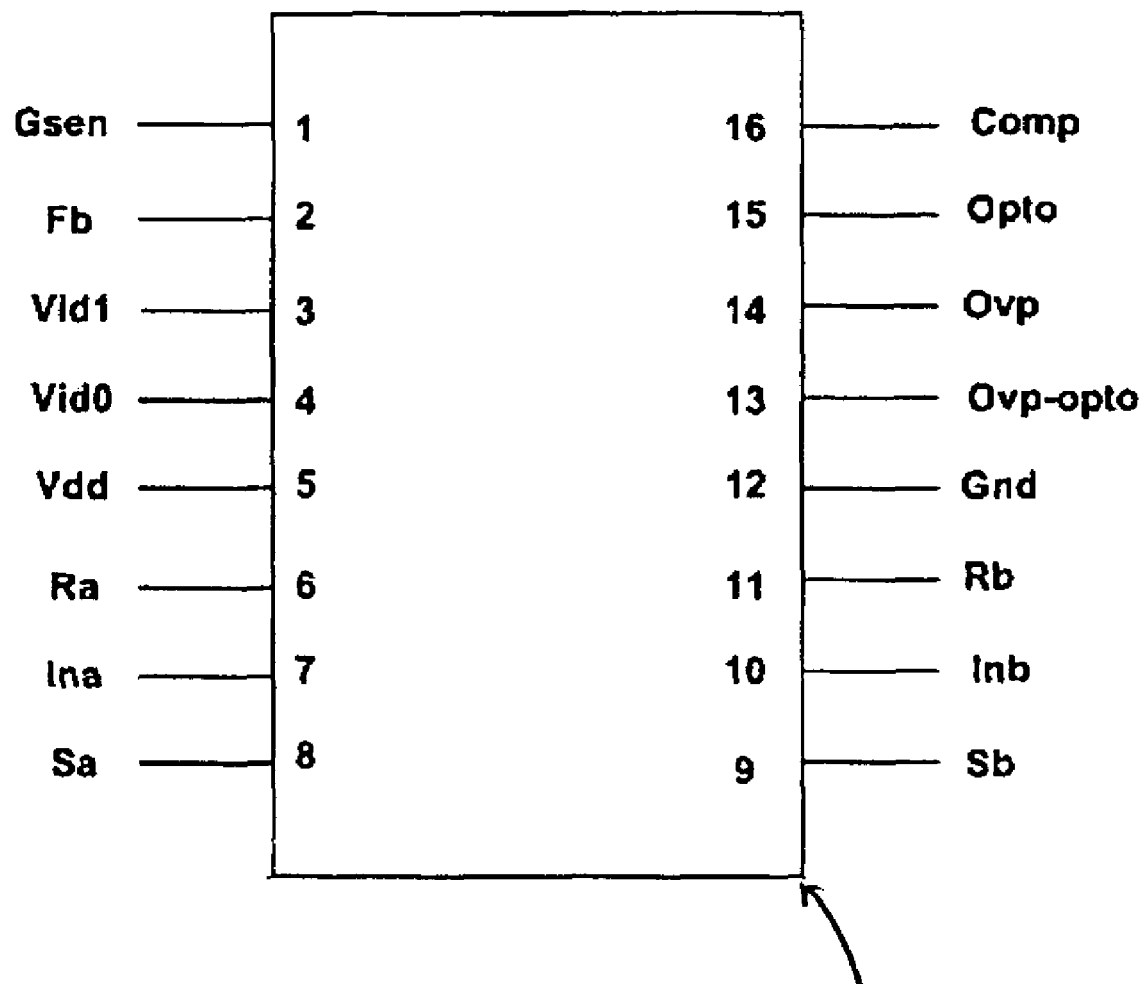
FIG. 3A illustrates an exemplary pin out of a secondary controller for the chipset, in accordance with a preferred embodiment of the present invention.

FIG. 3A illustrates the pin outs of the secondary controller 300. In a preferred embodiment, the secondary controller 300 includes sixteen (16) pins. Although, one skilled in the art will recognize that the secondary controller 300 can be packaged with more or less pins. Indeed, in a preferred embodiment, the secondary controller 300 is packaged in a 16-pin TSSOP (Thin-Shrink Small Outline Package) package. One skilled in the art will also appreciate that the secondary controller 300 can be packaged in a different package.

Table 2 illustrates a description of the preferred pin-outs of the secondary controller 300.

TABLE 2

| Pin Name | Pin Number | Pin Function |
|---|---|---|
| GSEN | 1 | Negative input of the remote-sensor amplifier; connects to the ground terminal of the load |
| FB | 2 | Positive input of the remote-sense amplifier; connects to the positive terminal of the load |
| Vid1 | 3 | Output voltage identifier |
| Vid0 | 4 | Output voltage identifier |
| Vdd | 5 | Power supply pin |
| RA | 6 | Input signal of reverse current detection (channel A) |
| INA | 7 | Input for synchronizing pulse, this pulse is provided by primary-side controller (channel A) |
| SA | 8 | Output of synchronizing pulse; this is the drive input of a gate-drive (channel A) |
| SB | 9 | Output of synchronizing pulse; this is the drive input of a gate-drive (channel B) |
| INB | 10 | Input for synchronizing pulse, this pulse is provided by primary-side controller (channel B) |

TABLE 2-continued

| Pin Name | Pin Number | Pin Function |
|---|---|---|
| RB | 11 | Input signal of reverse current detection (channel B) |
| GND | 12 | Ground pin |
| OVP_OPTO | 13 | Open drain output over-voltage protection alarm |
| OVP | 14 | Over-voltage protection reference adjustment pin |
| OPTO | 15 | Open drain output that is connected to opto coupler |
| COM | 16 | Output of transconductance amplifier |

Depending on what is connected to the input voltage, i.e., the Vid0 and Vid1 pins, the output voltage can be selected. Table 3 identifies the output voltage selection codes, wherein "F" refers to float, "1" refers to Vdd, and "0" refers to ground. The output voltages of Table 3 are preferred approximate values.

TABLE 3

| Vid0 | Vid1 | Output Voltage |
|---|---|---|
| 0 | 0 | 0.9 |
| 0 | 1 | 1.0 |
| 0 | F | 1.1 |
| 1 | 0 | 1.2 |
| 1 | 1 | 1.5 |
| 1 | F | 1.8 |
| F | 0 | 2.5 |
| F | 1 | 3.3 |
| F | F | 5.0 |

The secondary controller 300 enables high efficiency isolated power supplies by providing rectifications signals, built-in trimmer band-gap, error amplifier, over voltage protection, and other features necessary for secondary side controllers. The secondary controller provides a ratification signal that is synchronized to a power MOSFET switching on the primary side of an isolation transformer; the signal can be blocked by reverse current detection through low offset, fast comparator devices.

Additionally, the secondary controller 300 includes a trimmed band gap having an accuracy of approximately 1%, while different output voltages can be selected via two external set pins. Prior to the error amplifier a differential-to-signal (D 2 S) stage is used through which remote sensing is possible.

Figure 3B:
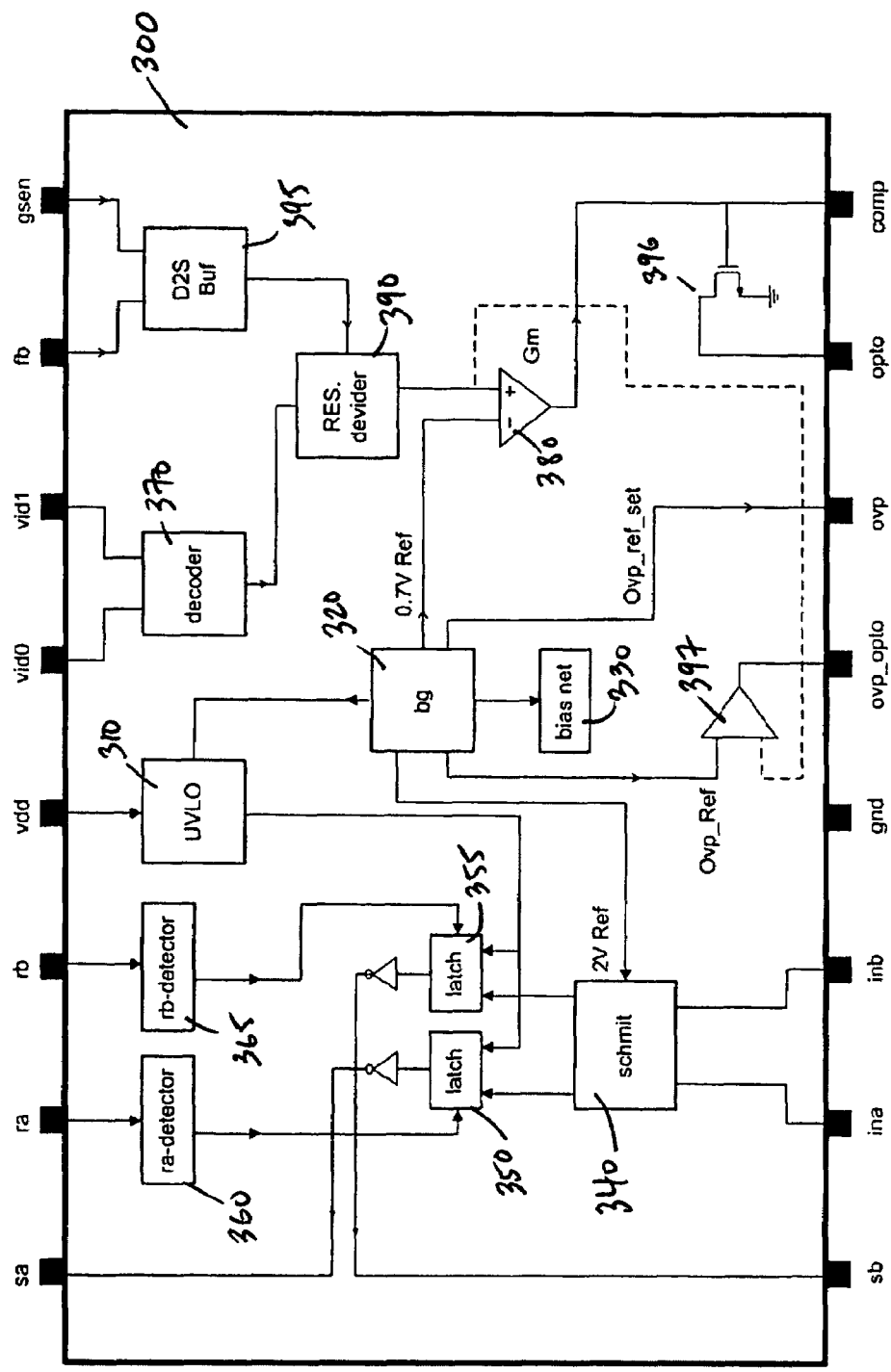
FIG. 3B illustrates a circuit diagram of the secondary controller for the chipset, in accordance with a preferred embodiment of the present invention.

FIG. 3B depicts a circuit block diagram of the secondary controller 300 is depicted. The secondary controller 300 can comprise an undervoltage lockout circuit 310, a band gap circuit 320, a bias net circuit 330, a Schmitt trigger 340, a pair of latches 350 and 355, an RA detector 360, an RB detector 365, a decoder 370, a comparator 380.

The supply voltage of the secondary controller 300 enters the Vdd pin. Upon entry the power from the Vdd pin is supplied to the undervoltage lockout circuit 310. The undervoltage lockout circuit 310 also receives the output of the band gap circuit 320. The band gap circuit 320 enables generating an accurate output voltage; indeed, preferably, the voltage can exhibit little dependence on temperature. Hence, the band gap circuit 320 can produce a temperature independent reference. The band gap circuit 320 can develop a reference having a nominally zero temperature coefficient, wherein the voltage of the band gap circuit 320 is trimmed within an accuracy of 1%. The result of the undervoltage lockout circuit 310 is fed to the latch 350 and the latch 355. The internal latches 350 and 355 are used for making the right timing of the freewheeling MOSFET, for turning on/off, during each cycle.

The signals received by the Vid0 and Vid1 pins are fed into the decoder 370. The signal from the decoder 370 is fed into a resistor divider 390. The decoder 370 decodes Vid0 and Vid1 to create, preferably, one of nine output settings, as noted in Table 3.

The signals of the FB and GSEN pins are fed together into a D2S buffer 395. The result of the D2S 395 is also fed into the resistor divider 390. The D2S buffer 395 acts as the remote-sense amplifier to directly sense the voltage across a load, compensating for voltage drops in PC board tracks or load connection wiring. The resistor divider 390 can be changed based on the Vin pin selection to define, preferably, one of nine outputs.

The band gap circuit 320 provides a 0.7V reference to a comparator 380. The comparator 380 compares the 0.7V reference to the signal from the resistor divider 390. The result of the comparator 380 is fed to a transistor 396 electronically parallel to the COMP pin. The drain of the transistor 396 is connected to the OPTO pin.

The band gap circuit 320 is also connected to the Schmitt trigger 340, a over current protection reference 397, a bias net circuit 330 and the OVP pin.

The Schmitt trigger 340 receives, not only the signal from the band gap circuit 320, but also signals from the INA and INB pins. The Schmitt trigger 340 then feeds the results into the latches 350 and 355.

The RA detector 360 and RB detector 365 receive the signals from the RA and RB pins, respectively. Then, the RA and RB detectors 360 and 365 feed into the latches 350 and 355. The signals from the latches 350 and 355 then are output into the SA and SB pins, respectively.

A benefit of secondary-side synchronous rectification is increased efficiency; another benefit is that it enables inductor current to remain continuous throughout the operating load range. This results in constant loop dynamics that are easy to compensate. In some cases, it may be necessary to turn off the freewheeling MOSFET when the current through this device attempts to flow from drain to source. Turning off this MOSFET can be done to enhance efficiency at low output current. When multiple power supplies are paralleled, the power supply with the highest output voltage has a tendency to source current into the power-supply outputs with lower output voltage. Turning off the freewheeling MOSFET also prevents this current back-flow. When inductor current is allowed to become discontinuous, the loop dynamics change and the circuit must be compensated accordingly to accommodate stable continuous and discontinuous mode operation. Turning off the freewheeling MOSFET is accomplished by using the zero-current comparator. Use this comparator to sense reverse current in the freewheeling MOSFET and turn off the device.

In preferred embodiment, Table 4 provides the electrical characteristics of the secondary controller 300. The specifications in Table 4 are preferred approximate values.

TABLE 4

| Parameter | Conditions | Min. | Typ. | Max. | Units |
|---|---|---|---|---|---|
| Power Supply Range |  | 3 |  | 5 | V |
| Operating Junction Temperature |  | −30 |  | 125 | ° C. |
| Power Supply |  |  |  |  |  |
| Power Supply Range |  | 3 |  | 5 | V |
| Current Consumption |  |  | 4 |  | mA |
| Synchronous Retifier Signals Path Delay |  |  |  |  |  |
| From ina to Sa (inb to sb) | with 10 pF load |  | 5 |  | ns |

TABLE 4-continued

| Parameter | Conditions | Min. | Typ. | Max. | Units |
|---|---|---|---|---|---|
| Input Schmitt Trigger | | | | | |
| Hysteresis | | | 100 | | mV |
| Internal Reference | | | 2 | | V |
| Reverse Current Detection | | | | | |
| Reference Voltage | | | 0 | | V |
| Propagation Delay | | | 11 | | ns |
| Dead Time (Blank) | | | 100 | | ns |
| Remote Sense Amplifier | | | | | |
| Input Impedance | | | 25 | | kΩ |
| Unity Gain Band Width | | | 10 | | MHz |
| CMRR | at 5 kHz | | −120 | | dB |
| UVLO | | | | | |
| Vdd Start Threshold | | | 3 | | V |
| Vdd Turn Off Threshold | | | 2.7 | | V |
| Transconductance Amplifier | | | | | |
| Gm | | | 4.2 | | ms |
| Internal Band Gap | | | | | |
| Reference | | 0.693 | 0.7 | 0.707 | V |

Referring now to FIG. 1, the circuit 100 is depicted in a preferred embodiment, wherein the primary controller 200 and the secondary controller 300 are connected.

A conventional gate driver can be used for the gate drivers 110 and 120. In an exemplary embodiment, the gate drivers 110 and 120 can be a Maxim® device, for instance, part numbers MAX5054-MAX5057, or National Semiconductor® part number LM5110.

In the circuit 100, Vin is the input voltage to the circuit 100. Preferably, Vin is between approximately 36V to 72V. Vin can be fed across a parallel set of resistors 141 and 142 to feed the LUVLO pin and resistors 143 and 144 to feed the VFF pin, and an electrically parallel resistor 145 and capacitor 146 to the OSC pin of the primary controller 200. Vin also provides power to the gate driver 110.

The gate driver 110 receives the Vin signal after flowing through an electrically parallel resistor 151 and capacitor 152 arrangement. This source is fed to the Vdd of the gate driver 110. A diode 153 is also in parallel with the resistor/capacitor arrangement, and in series with an inductor 154. The Vin signal is also fed to a parallel set of inductors 155 and 156, which are tied to the outa and outb pins of the gate driver via a pair of parallel transistor-diodes 160 and 161. The transistor-diodes 160 and 161 are tied to a resistor 157, then to ground. The transistor-diode 160 is connected to OUTA of the gate driver 110, and the other transistor-diode 161 is connected to the OUTB pin of the gate driver 110. The resistor 157 is also connected to the ISENSE pin of the primary controller 200.

Indeed, the arrangement of passive components external to the gate driver 110 can be based on a typical operating circuit for the selected gate driver, e.g., National Semiconductor® device.

The primary controller is connected to the gate driver 110. The Vdd and the SYNCVdd pins of the primary controller 200 are tied together and connected to 3.3V with the gate driver 110. Additionally, the B pin of the primary controller 200 is connected to the B pin of the gate driver 110, and the A pin of the primary controller 200 is connected to the A pin of the gate driver 110. PGND and GND of the primary controller 200 are tied to ground; SYNC is not connected. The SS pin is connected to a capacitor 147, which is tied to ground. The DELAY pin of the primary controller 200 is connected to an external RDELAY resistor 148, which is tied to ground.

The FB pin of the primary controller 200 is connected to the 3.3V power source via a resistor 149. Additionally, the FB pin is connected to a transistor 165, which is in connection to a light emitting diode (LED) 170 in connection with the 3.3V source. The LED 170 is forward biased with respect to the 3.3V source. The signal from the LED 170 is fed into the OPTO pin of the secondary controller 300. The primary controller 200 and the secondary controller 300 are connected via a transformer 180, wherein the transformer is connected by the SYNCA and SYNCB pins of the primary controller 200 and the INA and INB pins of the secondary controller 300. On the secondary controller side, a resistor 181 is tied to the INA and INB pins, as well as a diode 182 is connected to the INA pin, and diode 183 is connected to the INB pin.

The GND pin of the secondary controller 300 is tied to ground. The COMP pin can have a capacitor 191 in parallel with a series-connected a resistor 192 and capacitor 193. The OVPOPTO pin of the secondary controller is tied to a forward biased LED diode 174, which is connected to another transistor 166. The FB, GSENSE, Vid0, Vid1, and OVP pins are not connected to anything; they are no connects. The Vdd pin is tied to the 3.3V source of the gate driver 120. The SYNCA and SYNCB pins of the secondary controller 300 are connected to the A and B pins of the gate driver 120, respectively.

The REVERSEA and REVERSEB pins exit the secondary controller 300. The RESERVSEA pin is connected to the series inductor pair 195 and 196. The series inductor pair 195 and 196 are in parallel with the transistor-diode 162, transistor-diode 163 and inductor 197. The signal from OUTA of the gate driver 120 feeds the transistor-diode 162, and the signal from OUTB of the gate driver 120 feeds the transistor-diode 163. The REVERSEB pin is connected in parallel with the inductor 196, transistor-diode 163 and the inductor 197. The output is in parallel to the capacitor 198 and the resistor 199.

Figure 4:
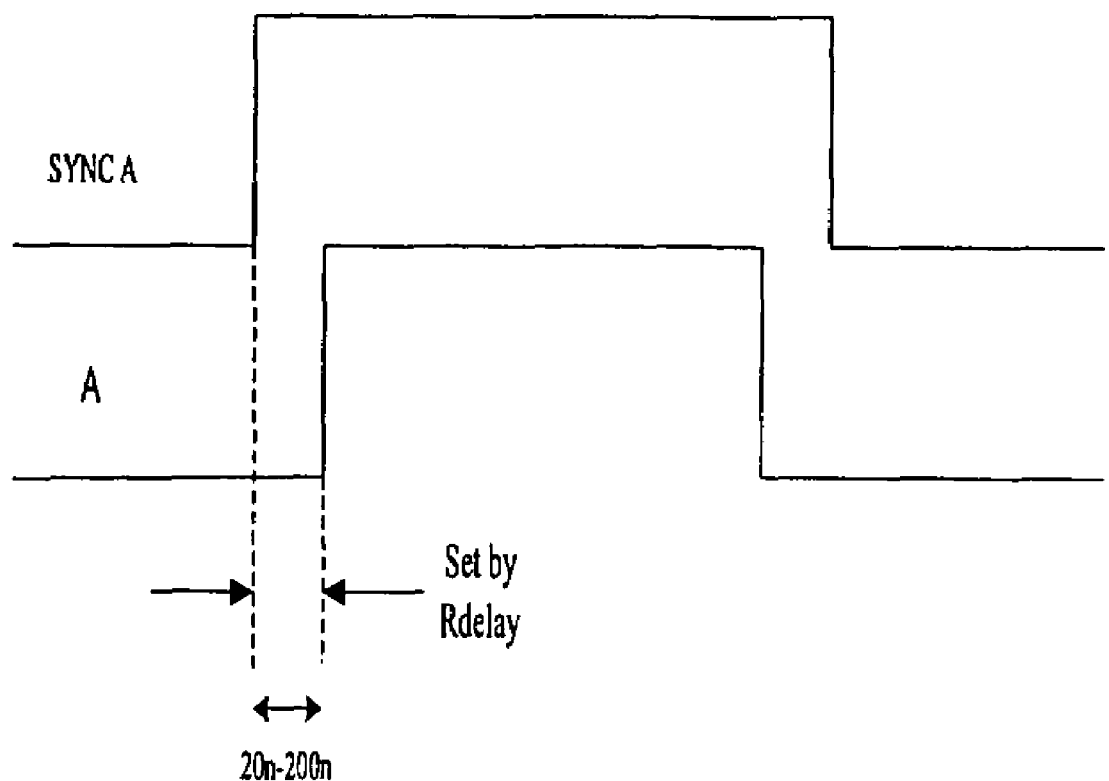
FIG. 4 illustrates a graphical representation of an output and synchronized rectifier timing, in accordance with a preferred embodiment of the present invention.

FIG. 4 illustrates an offset of SYNCA with respect to A. SYNCA and SYNCB are the drivers for synchronous rectifiers transformer. These signals should be able to drive 50 mA sink and source without too much drop. The A and B signals are inside the SYNC outputs. SYNCA will go on prior to A signal, by the delay amount set by RDELAY. Also, SYNCA will off after the A signal by the same amount of time. The same is applicable for SYNCA and SYNCB outputs. A high on the SYNC outputs indicate which synchronous rectifier switch is to be off. Hence, the natural state of the synchronous rectifier switches are on, and they will turn off when the SYNC outputs change to high.

While the invention has been disclosed in its preferred forms, it will be apparent to those skilled in the art that many modifications, additions, and deletions can be made therein without departing from the spirit and scope of the invention and its equivalents, as set forth in the following claims.

What is claimed is:

1. A chipset comprising:
   a first primary controller comprising:
      control and drive circuitry;
      a high speed oscillator having integrated feed forward compensation providing immediate duty cycle adjustment while maintaining a constant oscillator frequency;
      a soft start circuit;
      a band gap circuit coupled to the soft start circuit to produce an accurate reference;

a pulse width modulation circuit coupled to the soft start circuit;

an output circuit coupled to the pulse width modulation circuit, wherein the output circuit feeds the output of the first primary controller;

a secondary controller to provide rectification signals coupled to the first primary controller, the secondary controller comprising:

a band gap circuit for producing an accurate reference coupled to a Schmitt trigger, a comparator, a bias net circuit and an over-voltage lockout circuit; and at least two latches coupled to at least two detectors, wherein the latches are coupled to the Schmitt trigger;

a first gate driver connected to the first primary controller; and a second gate driver connected to the secondary controller.

2. The chipset of claim 1, the first gate driver driving at least two MOSFETs.

3. The chipset of claim 1, the high speed oscillator of the first primary controller having a frequency up to 1 MHz.

4. The chipset of claim 1, the band gap circuit of the first primary controller producing a temperature independent reference.

5. The chipset of claim 1, the first primary controller packaged in a 16-pin thin-shrink small outline package.

6. The chipset of claim 1, further comprising:

a second primary controller; and a second oscillator;

wherein the second oscillator synchronizes the first primary controller and the second primary controller, so that the first primary controller and the second primary controller are out of phase.

7. The chipset of claim 1, the secondary controller further comprising a resistor divider to proportionally reduce the voltage.

8. The chipset of claim 1, the secondary controller further comprising at least one comparator.

9. The chipset of claim 1, the secondary controller packaged in a 16-pin package.

* * * * *